(12) United States Patent
Kang et al.

(10) Patent No.: US 6,600,209 B1
(45) Date of Patent: Jul. 29, 2003

(54) MESH CAPACITOR STRUCTURE IN AN INTEGRATED CIRCUIT

(75) Inventors: Szu-sheng Kang, Hsinchu (TW); Chang-chang Wu, Hsinchu (TW)

(73) Assignee: Faraday Technology Corp. (TW)

( * ) Notice: Subject to any disclaimer, the term of this patent is extended or adjusted under 35 U.S.C. 154(b) by 0 days.

(21) Appl. No.: 10/251,558

(22) Filed: Sep. 19, 2002

(51) Int. Cl.$^7$ .............................................. H01L 29/00
(52) U.S. Cl. ........................ 257/535; 257/532; 257/534
(58) Field of Search ................................. 257/296, 532, 257/534, 535

(56) References Cited

U.S. PATENT DOCUMENTS 4,177,495 A  * 12/1979 Perret .......................... 361/279
6,297,524 B1 * 10/2001 Vathulya et al. ............ 257/303
2001/0035504 A1 * 11/2001 Hayes ....................... 250/515.1

* cited by examiner

Primary Examiner—Ngân V. Ngô
(74) Attorney, Agent, or Firm—Martine & Penilla, LLP

(57) ABSTRACT

A mesh capacitor structure in an integrated circuit can be made up by arranging at least a unit capacitor module in a coupling way, thereby enhancing its total capacitance by coupling capacitance. The unit capacitor module includes a plurality of first conductive strips extending in parallel with each other in a lateral direction and a plurality of second conductive strips formed over the plurality of first conductive strips and extending in parallel with each other in a longitudinal direction. In addition, a plurality of conductive plugs are formed at intersections between the odd-numbered second conductive strips and the odd-numbered or even-numbered first conductive strips, thereby forming a first electrode, and between the even-numbered second conductive strips and the even-numbered or odd-numbered first conductive strips, thereby forming a second electrode with an electrical polarity opposite to that of the first electrode.

16 Claims, 3 Drawing Sheets

MESH CAPACITOR STRUCTURE IN AN INTEGRATED CIRCUIT

BACKGROUND OF THE INVENTION

1. Field of the Invention

The present invention relates to a mesh capacitor structure and, more particularly, to a mesh capacitor structure, applied in an integrated circuit, with an enhanced capacitance through the use of coupling capacitances.

2. Description of the Related Art

FIG. 1 is a perspective view showing a conventional parallel plate capacitor structure 1 applied in an integrated circuit. Referring to FIG. 1, the conventional parallel capacitor structure 1 includes a lower metal plate 10 and an upper metal plate 11 arranged in parallel to each other with a distance therebetween. The lower metal plate 10 and the upper metal plate 11 are served as two opposite electrodes of the conventional parallel capacitor structure 1, respectively. The lower metal plate 10 is formed over a semiconductor substrate 13 through an insulating layer 12. The upper metal plate 11 is formed over the lower metal plate 10 through a dielectric layer (not shown).

The conventional parallel plate capacitor structure 1 mainly employs parallel electric fields generated between the lower and upper metal plates 10 and 11 to achieve a desirable capacitance, i.e., the so-called "parallel plate capacitance." Consequently, the capacitance of the conventional parallel plate structure 1 is proportional to the surface area of the lower and upper metal plates 10 and 11. As the processing technology in the field of integrated circuits continuously improves, semiconductor circuit devices can be manufactured much smaller, thereby raising the integration of integrated circuits. However, it is necessary for the conventional parallel capacitor structure 1 to occupy a relatively large area in order to provide a sufficient capacitance. As a result, the aim of higher integration of integrated circuits is undesirably obstructed.

SUMMARY OF THE INVENTION

In view of the above-mentioned problem, an object of the present invention is to provide a mesh capacitor structure, applied in an integrated circuit, with an enhanced capacitance through the use of coupling capacitances.

Another object of the present invention is to provide a mesh capacitor structure, applied in an integrated circuit, which may be formed in various shapes and sizes depending on a requirement of circuit design by arranging a suitable number of unit capacitor modules.

According to one aspect of the present invention, a mesh capacitor structure in an integrated circuit are constituted by coupling at least one unit capacitor module on a semiconductor substrate. Each of the at least one unit capacitor module includes a plurality of first conductive strips, a plurality of second conductive strips, and a plurality of conductive plugs.

The plurality of first conductive strips are formed on the semiconductor substrate, extending in parallel to each other in a lateral direction. The plurality of second conductive strips are formed over the plurality of first conductive strips through a dielectric layer, extending in parallel to each other in a longitudinal direction.

The plurality of conductive plugs pass through the dielectric layer and are formed at intersections between odd-numbered second conductive strips and odd-numbered first conductive strips as well as between even-numbered second conductive strips and even-numbered first conductive strips such that the odd-numbered second conductive strips are connected to the odd-numbered first conductive strips, thereby serving as a first electrode, and the even-numbered second conductive strips are connected to the even-numbered first conductive strips, thereby serving as a second electrode with an electrical polarity opposite to the first electrode.

According to another aspect of the invention, the plurality of conductive plugs pass through the dielectric layer and are formed at intersections between odd-numbered second conductive strips and even-numbered first conductive strips as well as between even-numbered second conductive strips and odd-numbered first conductive strips such that the odd-numbered second conductive strips are connected to the even-numbered first conductive strips, thereby serving as a first electrode, and the even-numbered second conductive strips are connected to the odd-numbered first conductive strips, thereby serving as a second electrode with an electrical polarity opposite to the first electrode.

The meshed structure of both the first and second electrodes of the mesh capacitor structure according to the present invention gives rise to an advantage of reducing the undesirable parasitic inductance. Furthermore, the mesh capacitor structure according to the present invention can easily be coupled, both in the lateral and longitudinal directions, to other circuit elements in an integrated circuit because each of the first and second electrodes has conductive strips extending in the lateral and longitudinal directions. Consequently, the flexibility of the circuit design is significantly improved.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 2A:
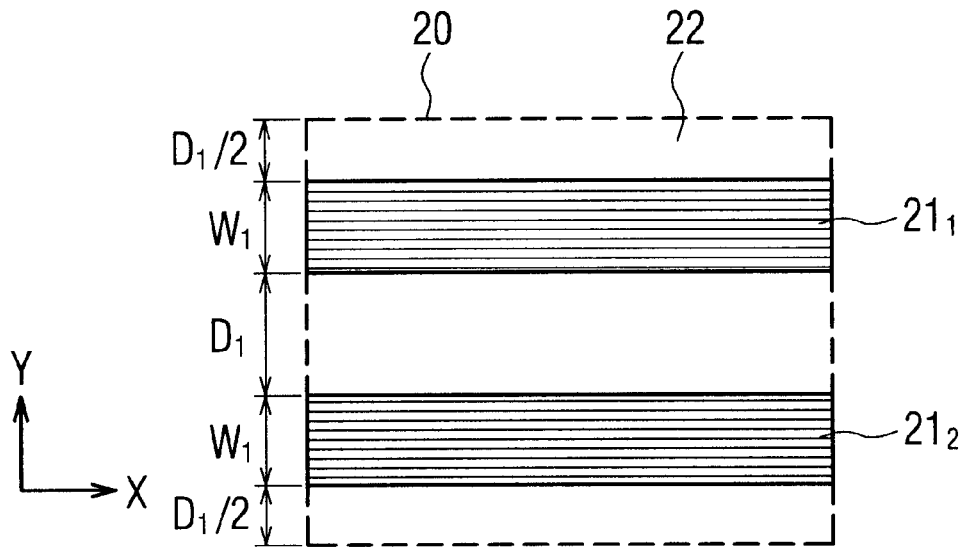
FIGS. 2(*a*) and 2(*b*) are top views showing an example of a unit capacitor module by which a mesh capacitor structure in an integrated circuit according to the present invention is constituted.

FIGS. 2(*a*) and 2(*b*) are top views showing an example of a unit capacitor module by which a mesh capacitor structure in an integrated circuit according to the present invention is constituted. Referring to FIG. 2(*a*), on a rectangular region 20 (defined by broken lines) of an insulating layer 22 formed on a semiconductor substrate (not shown), two lower conductive strips $21_1$ and $21_2$ with a width of $W_1$ extend in parallel in an X direction. For example, the lower conductive strips $21_1$ and $21_2$ are made of a metallic material such as Al or Cu. A distance of $D_1$ separates these two lower conductive strips $21_1$ and $21_2$ from each other. Moreover, each of the lower conductive strips $21_1$ and $21_2$ is separated from the corresponding closest side of the rectangular region 20 by half of $D_1$. As a result of such design of size as shown in FIG. 2(a), a plurality of lower conductive strips $21_1, \ldots, 21_n$ are allowed to be disposed with a constant interval of $D_1$ when a plurality of rectangular unit capacitor modules 2 according to the present invention are arranged to connect in a Y direction.

Figure 2B:
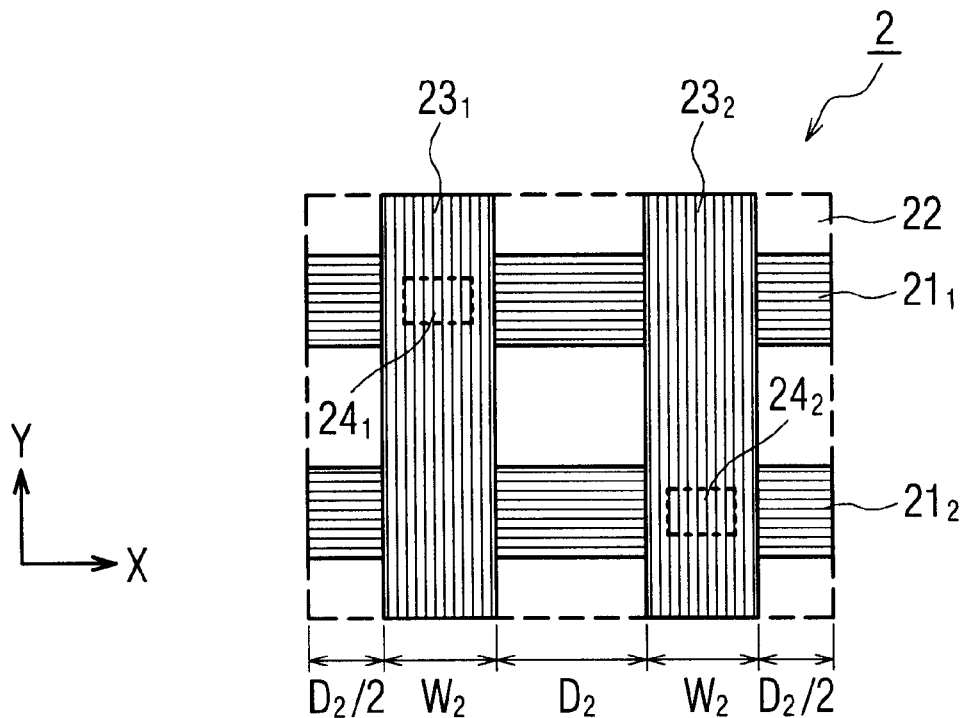

Referring to FIG. 2(b), on a rectangular region 20, two upper conductive strips $23_1$ and $23_2$ with a width of $W_2$ are formed over the two lower conductive strips $21_1$ and $21_2$ through a dielectric layer (not shown). In addition, the upper conductive strips $23_1$ and $23_2$ extend in parallel in the Y direction in such a manner that the upper conductive strips $23_1$ and $23_2$ are substantially perpendicular to the lower conductive strips $21_1$ and $21_2$ when observed in a top view. For example, the upper conductive strips $23_1$ and $23_2$ are made of a metallic material such as Al or Cu. A distance of $D_2$ separates these two upper conductive strips $23_1$ and $23_2$ from each other. Moreover, each of the upper conductive strips $23_1$ and $23_2$ is separated from the corresponding closest side of the rectangular region 20 by half of $D_2$. As a result of such design of size as shown in FIG. 2(b), a plurality of lower conductive strips $23_1, \ldots, 23_n$ are allowed to be disposed with a constant interval of $D_2$ when a plurality of rectangular unit capacitor modules 2 according to the present invention are arranged to connect in the X direction.

As shown in FIG. 2(b), conductive plugs $24_1$ and $24_2$ passing through the dielectric layer (not shown) are disposed at intersections between the upper conductive strip $23_1$ and the lower conductive strip $21_1$ as well as between the upper conductive strip $23_2$ and the lower conductive strip $21_2$, respectively. For example, the conductive plugs $24_1$ and $24_2$ are made of tungsten (W). In other words, the upper conductive strip $23_1$ is connected to the lower conductive strip $21_1$ through the conductive plug $24_1$ while the upper conductive strip $23_2$ is connected to the lower conductive strip $21_2$ through the conductive plug $24_2$. In the unit capacitor module 2 as shown in FIG. 2(b), the upper conductive strip $23_1$ and the lower conductive strip $21_1$ are served as a first electrode of the mesh capacitor structure while the upper conductive strip $23_2$ and the lower conductive strip $21_2$ are served as a second electrode with an electrical polarity opposite to that of the first electrode of the mesh capacitor structure.

It should be noted that although a case where the conductive plugs $24_1$ and $24_2$ are disposed at the intersections between the upper conductive strip $23_1$ and the lower conductive strip $21_1$ as well as between the upper conductive strip $23_2$ and the lower conductive strip $21_2$, respectively, has been described with reference to FIG. 2(b), the conductive plugs $24_1$ and $24_2$ may be disposed at the intersections between the upper conductive strip $23_1$ and the lower conductive strip $21_2$ as well as between the upper conductive strip $23_2$ and the lower conductive strip $21_1$, respectively, as an alternative. With respect to the latter, therefore, the unit capacitor module employs the upper conductive strip $23_1$ and the lower conductive strip $21_2$ as a first electrode of the mesh capacitor structure while using the upper conductive strip $23_2$ and the lower conductive strip $21_1$ as a second electrode with an electrical polarity opposite to that of the first electrode of the mesh capacitor structure.

In addition, although the unit capacitor module 2 as shown in FIG. 2(b) has two upper conductive strips and two lower conductive strips, the unit capacitor module according to present invention is not limited to this and may have three or more upper conductive strips and three or more lower conductive strips. Moreover, although the upper conductive strips and the lower conductive strips of the unit capacitor module 2 shown in FIG. 2(b) are arranged in parallel with a constant interval, the unit capacitor module according to the present invention is not limited to this and the upper conductive strips and/or the lower conductive strips may be disposed in parallel to each other with different intervals.

Figure 1:
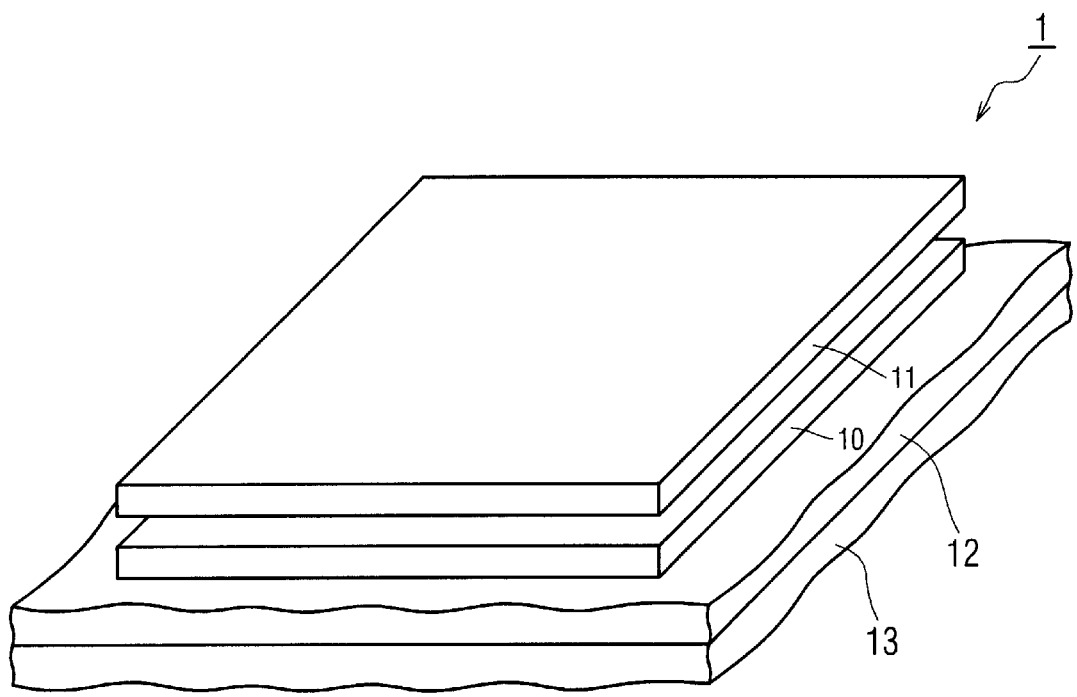
FIG. 1 is a perspective view showing a conventional parallel plate capacitor structure applied in an integrated circuit.
Figure 4:
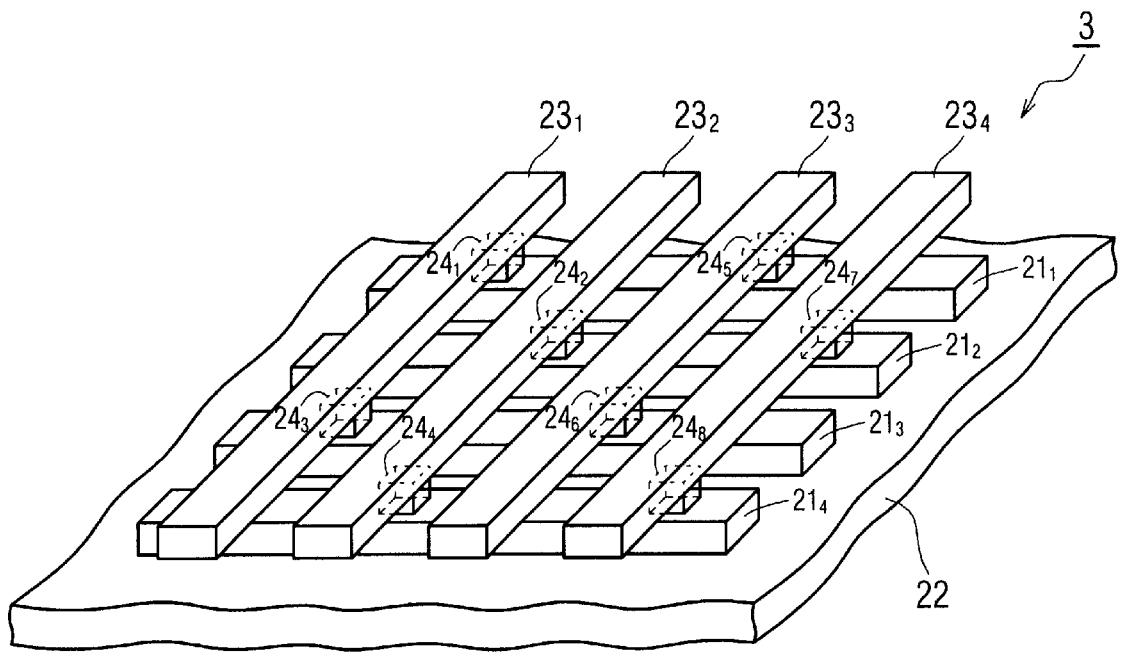
FIG. 4 is a perspective view showing a mesh capacitor structure shown in FIG. 3.
Figure 3:
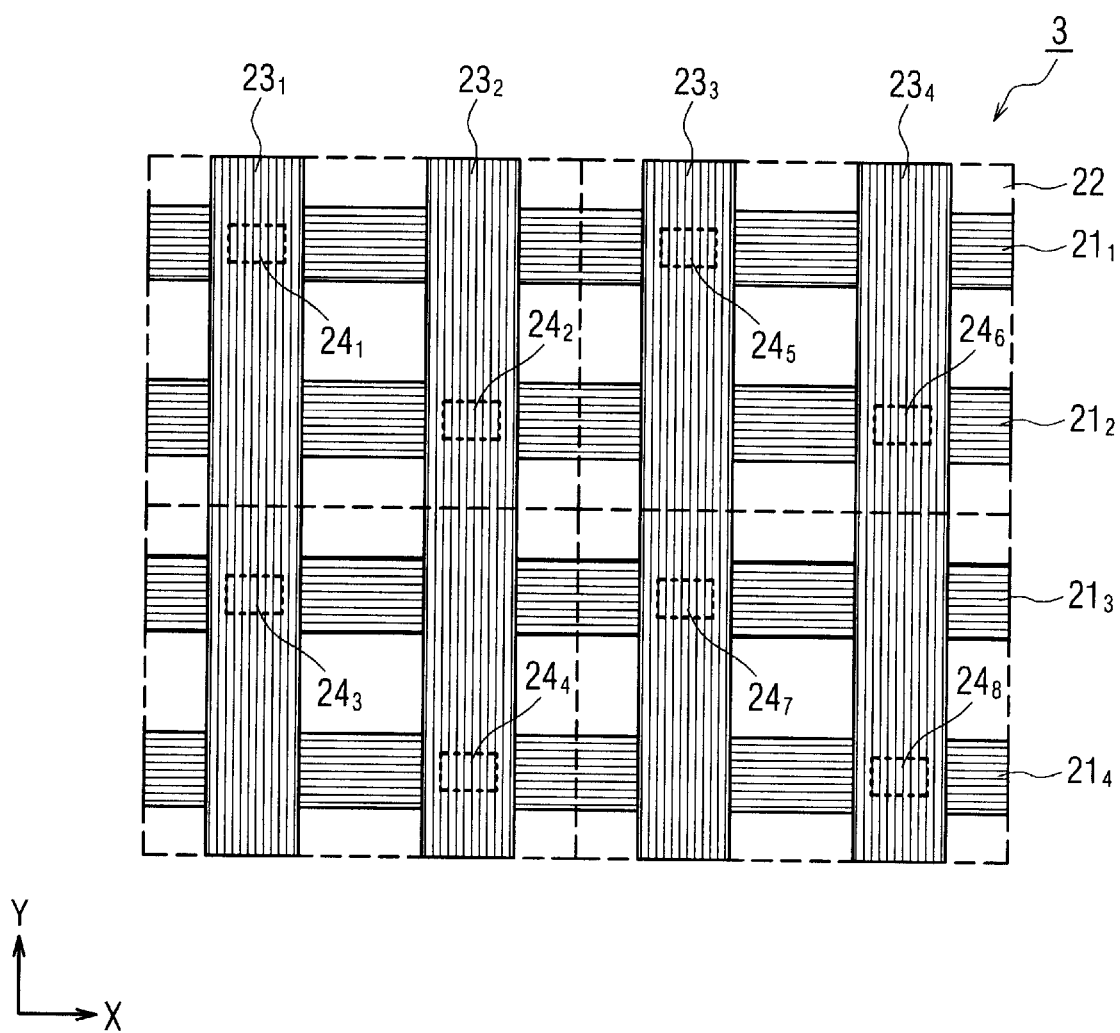
FIG. 3 is a top view showing a mesh capacitor structure constituted by a coupling arrangement of four unit capacitor modules shown in FIG. 2(*b*)

FIG. 3 is a top view showing a mesh capacitor structure 3 constituted by a coupling arrangement of four unit capacitor modules 2 shown in FIG. 2(b). FIG. 4 is a perspective view showing a mesh capacitor structure 3 shown in FIG. 3. Referring to FIGS. 3 and 4, the four unit capacitor modules 2 as shown in FIG. 2(b) are arranged in a 2×2 array so as to constitute the mesh capacitor structure 3. Four lower conductive strips $21_1$, $21_2$, $21_3$, and $21_4$ with a width of $W_1$ are disposed in parallel to each other with a constant interval of $D_1$ while four upper conductive strips $23_1$, $23_2$, $23_3$, and $23_4$ with a width of $W_2$ are disposed in parallel to each other with a constant interval of $D_2$.

Each of four intersections constituted by the odd-numbered upper conductive strips $23_1$ and $23_3$ and the odd-numbered lower conductive strips $21_1$ and $21_3$ and each of four intersections constituted by the even-numbered upper conductive strips $23_2$ and $23_4$ and the even-numbered lower conductive strips $21_2$ and $21_4$ are correspondingly provided with one of conductive plugs $24_1$ to $24_8$ which are passing through a dielectric layer (not shown). In this way, the odd-numbered upper conductive strips $23_1$ and $23_3$ together with the odd-numbered lower conductive strips $21_1$ and $21_3$ constitute a first electrode of the mesh capacitor structure 3 while the even-numbered upper conductive strips $23_2$ and $23_4$ together with the even-numbered conductive strips $21_2$ and $21_4$ constitute a second electrode with an electrical polarity opposite to the first electrode of the mesh capacitor structure.

In the mesh capacitor structure 3 shown in FIGS. 3 and 4, the coupling capacitance generated between the first electrode, which is constituted by the upper conductive strips $23_1$ and $23_3$ together with the lower conductive strips $21_1$ and $21_3$, and the second electrode, which is constituted by the upper conductive strips $23_2$ and $23_4$ together with the lower conductive strips $21_2$ and $21_4$, significantly enhances the total capacitance of the mesh capacitor structure 3. Therefore, the capacitance of the mesh capacitor structure is larger than that of the conventional parallel plate capacitor structure with the same size as the former.

Moreover, the meshed structure of both the first and second electrodes of the mesh capacitor structure 3 according to the present invention gives rise to an advantage of reducing the undesirable parasitic inductance. Furthermore, it is permissible for the mesh capacitor structure 3 according to the present invention to be coupled, both in the X and Y directions, to other circuit elements in an integrated circuit because each of the first and second electrodes consists of not only conductive strips extending in the X direction but also conductive strips extending in the Y direction. Therefore, the flexibility of the circuit design is significantly improved.

It should be noted that, in addition to the mesh capacitor structure 3 in a form of the 2×2 array as shown in FIGS. 3 and 4, the present invention can be applied to mesh capacitor structures formed in various shapes and sizes depending on a requirement of circuit design by arranging a suitable number of unit capacitor modules 2.

Additionally, the mesh capacitor structure according to the present invention is not limited to two layers of conductive strips and may also consist of three or more layers of conductive strips. In all cases, the conductive strips of the same layer extend in parallel to each other in such a manner that the conductive strips of any two adjacent layers are substantially perpendicular to each other when observed in a top view. Furthermore, the conductive plugs are elongated to connect every layer of conductive strips together.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A mesh capacitor structure in an integrated circuit, formed on a semiconductor substrate, comprising:
   a plurality of first conductive strips formed on said semiconductor substrate and extending in parallel to each other in a first direction;
   a plurality of second conductive strips formed over said plurality of first conductive strips through a dielectric layer and extending in parallel to each other in a second direction which is substantially perpendicular to said first direction when observed in a top view; and
   a plurality of conductive plugs passing through said dielectric layer and formed at intersections between odd-numbered conductive strips of said plurality of second conductive strips and odd-numbered conductive strips of said plurality of first conductive strips as well as between even-numbered conductive strips of said plurality of second conductive strips and even-numbered conductive strips of said plurality of first conductive strips such that said odd-numbered conductive strips of said plurality of second conductive strips are connected to said odd-numbered conductive strips of said plurality of first conductive strips, thereby serving as a first electrode, and said even-numbered conductive strips of said plurality of second conductive strips are connected to said even-numbered conductive strips of said plurality of first conductive strips, thereby serving as a second electrode with an electrical polarity opposite to said first electrode.

2. The mesh capacitor structure according to claim 1, wherein said plurality of first conductive strips are disposed in parallel with a constant interval.

3. The mesh capacitor structure according to claim 1, wherein said plurality of second conductive strips are disposed in parallel with a constant interval.

4. A mesh capacitor structure in an integrated circuit, formed on a semiconductor substrate, comprising:
   a plurality of first conductive strips formed on said semiconductor substrate and extending in parallel to each other in a first direction;
   a plurality of second conductive strips formed over said plurality of first conductive strips through a dielectric layer and extending in parallel to each other in a second direction which is substantially perpendicular to said first direction when observed in a top view; and
   a plurality of conductive plugs passing through said dielectric layer and formed at intersections between odd-numbered conductive strips of said plurality of second conductive strips and even-numbered conductive strips of said plurality of first conductive strips as well as between even-numbered conductive strips of said plurality of second conductive strips and odd-numbered conductive strips of said plurality of first conductive strips such that said odd-numbered conductive strips of said plurality of second conductive strips are connected to said even-numbered conductive strips of said plurality of first conductive strips, thereby serving as a first electrode, and said even-numbered conductive strips of said plurality of second conductive strips are connected to said odd-numbered conductive strips of said plurality of first conductive strips, thereby serving as a second electrode with an electrical polarity opposite to said first electrode.

5. The mesh capacitor structure according to claim 4, wherein said plurality of first conductive strips are disposed in parallel with a constant interval.

6. The mesh capacitor structure according to claim 4, wherein said plurality of second conductive strips are disposed in parallel with a constant interval.

7. A mesh capacitor structure in an integrated circuit, constituted by coupling at least one unit capacitor module on a semiconductor substrate, said at least one unit capacitor module comprising:
   a plurality of first conductive strips formed on said semiconductor substrate and extending in parallel to each other in a first direction;
   a plurality of second conductive strips formed over said plurality of first conductive strips through a dielectric layer and extending in parallel to each other in a second direction which is substantially perpendicular to said first direction when observed in a top view; and
   a plurality of conductive plugs passing through said dielectric layer and formed at intersections between odd-numbered conductive strips of said plurality of second conductive strips and odd-numbered conductive strips of said plurality of first conductive strips as well as between even-numbered conductive strips of said plurality of second conductive strips and even-numbered conductive strips of said plurality of first conductive strips such that said odd-numbered conductive strips of said plurality of second conductive strips are connected to said odd-numbered conductive strips of said plurality of first conductive strips, thereby serving as a first electrode, and said even-numbered conductive strips of said plurality of second conductive strips are connected to said even-numbered conductive strips of said plurality of first conductive strips, thereby serving as a second electrode with an electrical polarity opposite to said first electrode.

8. The mesh capacitor structure according to claim 7, wherein said plurality of first conductive strips are disposed in parallel with a constant interval.

9. The mesh capacitor structure according to claim 7, wherein said plurality of second conductive strips are disposed in parallel with a constant interval.

10. The mesh capacitor structure according to claim 7, wherein said plurality of first conductive strips are two first conductive strips.

11. The mesh capacitor structure according to claim 7, wherein said plurality of second conductive strips are two second conductive strips.

12. A mesh capacitor structure in an integrated circuit, constituted by coupling at least one unit capacitor module on a semiconductor substrate, said at least one unit capacitor module comprising:
   a plurality of first conductive strips formed on said semiconductor substrate and extending in parallel to each other in a first direction;

a plurality of second conductive strips formed over said plurality of first conductive strips through a dielectric layer and extending in parallel to each other in a second direction which is substantially perpendicular to said first direction when observed in a top view; and a plurality of conductive plugs passing through said dielectric layer and formed at intersections between odd-numbered conductive strips of said plurality of second conductive strips and even-numbered conductive strips of said plurality of first conductive strips as well as between even-numbered conductive strips of said plurality of second conductive strips and odd-numbered conductive strips of said plurality of first conductive strips such that said odd-numbered conductive strips of said plurality of second conductive strips are connected to said even-numbered conductive strips of said plurality of first conductive strips, thereby serving as a first electrode, and said even-numbered conductive strips of said plurality of second conductive strips are connected to said odd-numbered conductive strips of said plurality of first conductive strips, thereby serving as a second electrode with an electrical polarity opposite to said first electrode.

13. The mesh capacitor structure according to claim 12, wherein said plurality of first conductive strips are disposed in parallel with a constant interval.

14. The mesh capacitor structure according to claim 12, wherein said plurality of second conductive strips are disposed in parallel with a constant interval.

15. The mesh capacitor structure according to claim 12, wherein said plurality of first conductive strips are two first conductive strips.

16. The mesh capacitor structure according to claim 12, wherein said plurality of second conductive strips are two second conductive strips.

* * * * *